United States Patent [19]
Kotake

[11] Patent Number: 5,127,982
[45] Date of Patent: Jul. 7, 1992

[54] POLYCRYSTAL PIEZOELECTRIC DEVICE AND METHOD OF PRODUCING THE SAME

[75] Inventor: Shigeo Kotake, Kita, Japan

[73] Assignees: Agency of Industrial Science & Technology, Tokyo, Japan; Ministry of International Trade & Industry, Tokyo, Japan

[21] Appl. No.: 731,466

[22] Filed: Jul. 17, 1991

[30] Foreign Application Priority Data

Jul. 19, 1990 [JP] Japan .................................. 2-191003

[51] Int. Cl.⁵ .............................................. C30B 31/00
[52] U.S. Cl. .................................. 156/603; 252/62.9; 310/311; 156/619.1; 156/DIG. 87
[58] Field of Search ............ 156/603, 619.1, DIG. 87; 252/62.9 R; 310/311

[56] References Cited

U.S. PATENT DOCUMENTS 3,998,687 12/1976 Ballman et al. .................. 156/619.1

OTHER PUBLICATIONS

"Bulk-ware device of single-crystal piezoelectric substrate", Iegi et al., Jpn. Kokai Tokkyo Koho, 5 pp. (1991).

Primary Examiner—Robert Kunemund
Assistant Examiner—Felisa Garrett
Attorney, Agent, or Firm—Oblon, Spivak, McClelland, Maier & Neustadt

[57] ABSTRACT

A polycrystal piezoelectric device consists of a plurality of crystals formed by growth of spherulites including a piezoelectric phase consisting of $Li_2B_4O_7$. The orientation of the crystals shifts progressively over about 90 degrees between opposite sides of the device.

6 Claims, 4 Drawing Sheets

300μm

150μm

60μm

□ < 0.5
▦ < 1.0
▧ < 1.5
▦ < 2.0
▨ < 2.5
▩ < 3.0
■ > 3.0

□ < 0.5
▦ < 1.0
▧ < 2.0
▦ < 3.0
▨ < 4.0
▩ < 5.0
■ > 5.0

POLYCRYSTAL PIEZOELECTRIC DEVICE AND METHOD OF PRODUCING THE SAME

BACKGROUND OF THE INVENTION

1. Field of the Invention

This invention relates to a polycrystal piezoelectric device consisting of crystals which have a piezoelectric phase and are oriented in different specific directions.

2. Prior Art Statement

Piezoelectric devices which convert electrical energy to mechanical oscillation are well known and are formed of ferroelectric materials such as barium titanate, PZT and the like or of nonferroelectric materials such as $Ba_2TiBe_2O_2$, $Li_2B_2O_7$ and the like.

Piezoelectric devices made of ferroelectric material are generally fabricated by subjecting a sintered ferroelectric material body to polarizing treatment for obtaining a device whose crystals are polarized in the same direction.

On the other hand, in the case where barium titanate crystals or other such crystals having a piezoelectric phase are obtained by crystallization from glass, the crystals uniformly precipitated by nucleation treatment are also subjected to polarizing treatment for orientation in the same direction. Since, similarly to the case of fabricating a piezoelectric device of ferroelectric material, the polarizing treatment cannot be conducted so as to polarize the different crystals having a piezoelectric phase in different directions, the resulting piezoelectric device exhibits uniform crystallographic orientation.

In a piezoelectric device wherein the crystals having a piezoelectric phase are oriented uniformly in the aforesaid manner, oscillation is produced in a specific frequency mode throughout the entire device. In contrast, in a device in which the orientation of the crystals with piezoelectric phase varies, strictly speaking the oscillation mode differs at different portions of the device and the various individual oscillations interact to form a complex composite oscillation. The device thus resembles one obtained by bonding together a number of different piezoelectric devices and, compared with a device having uniform crystallographic orientation, possesses a functional gradient differing in symmetry.

One object of this invention is thus to provide a polycrystal piezoelectric device of a novel structure in which the oscillation mode differs between different positions thereof.

Another object of the invention is to provide a method of producing such a device.

SUMMARY OF THE INVENTION

For achieving the first object, one aspect of this invention provides a polycrystal piezoelectric device in which a plurality of crystals formed by growth of a plurality of spherulites having a piezoelectric phase so as to vary continuously in orientation over about 90 degrees from one side of the device to the other.

For achieving the second object, another aspect of the invention provides a method of producing a polycrystal piezoelectric device comprising the step of heat treating an amorphous material in which spherulites including a piezoelectric phase crystallize from a bulk glass phase so as to impart it with a temperature gradient extending from not lower than its crystallization temperature to not higher than its melting point. When the amorphous material is caused to have such a temperature gradient, the direction of the spherulites formed laterally at the high-temperature side of the amorphous material shifts gradually in the vertical direction in the course of the growth of the crystals toward the low-temperature side. As a result, the direction of the crystals at the low-temperature side comes to be offset by 90 degrees from that of the crystals at the high-temperature side.

In the polycrystal piezoelectric device having this crystallographic structure, crystals nearer to the high-temperature side exhibit different oscillation modes from those near to the low-temperature side and, as a result, the device possesses a functional gradient differing in symmetry.

The above and other features of the present invention will become apparent from the following description made with reference to the drawings.

DESCRIPTION OF THE PREFERRED EMBODIMENT

The inventor discovered that when an amorphous material in which spherulites crystallize into the bulk glass phase is subjected to crystallization treatment that imparts it with a temperature gradient, spherulites form only on the high-temperature side and as the crystals of the spherulites grow in the direction of the low-temperature side, the direction thereof gradually and continuously changes from the lateral direction to the vertical direction. The invention was completed on the basis of this discovery.

To be usable in the present invention, the amorphous material is required to be one of a composition which assumes an amorphous single phase when rapidly cooled and in which crystallization treatment causes spherulites including a piezoelectric phase to form in the bulk glass phase. Insofar as these requirements are met, it may be either a ferroelectric material or a nonferroelectric material. A preferred example of the amorphous material is $B_2O_{3(x)}$—$Li_2O_{(100-x)}$ ($x = 66.6$–$80.0$ mol%) pseudo-two phase oxide, which forms spherulites including $Li_2B_4O_7$ as a piezoelectric phase.

This amorphous material is prepared by blending prescribed amounts of $Li_2CO_3$ powder and $H_3BO_3$ powder, preheating the mixture in a crucible for removing $H_2O$ and $CO_2$, thoroughly melting the result by heating to a temperature higher than the melting point by 100°–200° C., pouring the molten material into a mold of desired shape, and cooling it. When the cooling rate of the shaped material tends to be slow, it is rapidly cooled by use of a metal cooling plate or the like.

Since a thick amorphous material obtained in this way easily cracks due to thermal strain, annealing in the vicinity of the glass transition temperature is carried out in advance.

This $B_2O_3$—$Li_2O$ system amorphous material is then subjected to crystallization heat treatment.

Figure 1:
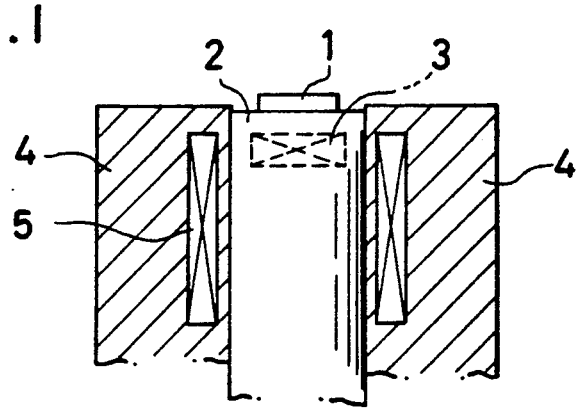
FIG. 1 is a schematic sectional view of a temperature gradient furnace suitable for use in producing the piezoelectric device according to the present invention.
Figure 2A:
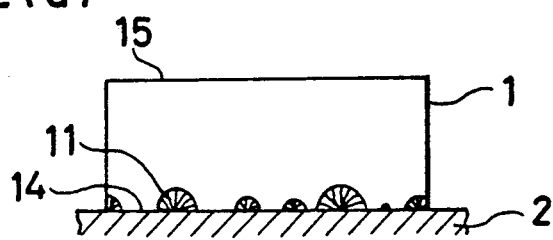
FIG. 2(a) is a view for explaining the state in which spherulites are formed at the high-temperature side of the amorphous material.
Figure 2B:
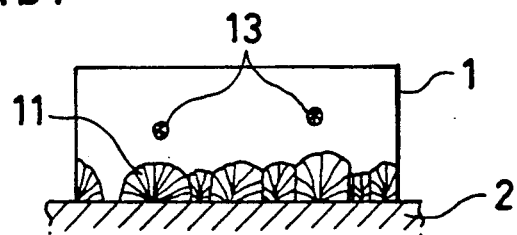
FIG. 2(b) is a view for explaining the growth of the spherulites shown in FIG. 2(b).
Figure 2C:
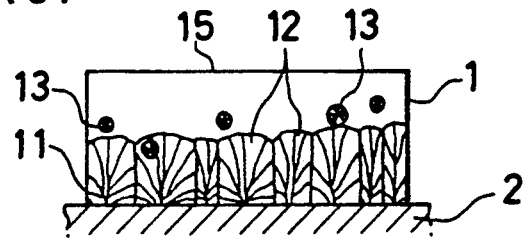
FIG. 2(c) is a view for explaining growth of the crystals in the direction of the low-temperature side.
Figure 2D:
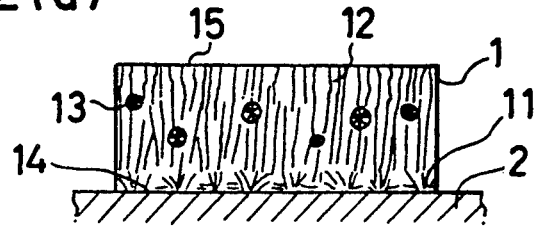
FIG. 2(d) is a view showing the state of the crystals after they have grown to the low-temperature side.

FIG. 1 shows a temperature gradient furnace suitable for carrying out the crystallization heat treatment of the amorphous material. The furnace 4 is of hollow cylindrical shape and has a heating element 5 embedded in the vicinity its inner wall and a column-like hot plate 2 fitted in the center hole thereof so as to be vertically slidable. A heating element 3 is embedded in the hot plate 2 for heating an amorphous material specimen placed thereon to a prescribed temperature.

The amorphous material specimen is disposed so as to have one surface in intimate contact with the hot plate 2. The heating elements 3 and 5 heat the hot plate 2 to a prescribed temperature, causing the temperature of the surface of the amorphous specimen 1 in contact with the hot plate 2 to rise to a prescribed temperature while allowing the surface on the opposite side to remain at a lower temperature. The amorphous material as a whole is thus heated so as to have a temperature gradient. If the hot plate 2 is made of a material which reacts with the amorphous material specimen 1, carbon or some other inert material is disposed between the two. Since the nucleation occurrence rate of the amorphous material is affected by its temperature and surface condition, the surface thereof to be placed in contact with the hot plate 2 can, if necessary, be polished to a smooth finish using emery paper or alumina powder and/or can be modified in its surface state by subjecting it to thermal shock using a laser beam or the like.

The amorphous material is heated so that the high-temperature side thereof, i.e. the side in contact with the hot plate, has a temperature not higher than the melting point of the amorphous material while its low-temperature side has a temperature not lower than the crystallization temperature thereof. For ensuring that nucleation does not occur at other portions than the high-temperature side, it is necessary to impart the amorphous material with a large temperature gradient while still maintaining the low-temperature side at a temperature adequate for ensuring crystallization. Thus where a thin piece of amorphous material is to be imparted with a large temperature gradient, the low-temperature side is forcibly cooled by an appropriate method while the high-temperature side is being heated.

A $B_2O_3$—$Li_2O$ system material has a melting point in the vicinity of 900° C. and a crystallization temperature in vicinity of 550° C.

The spherulite nucleation occurrence rate varies greatly with temperature. In the case of a $B_2O_3$—$Li_2O$ system material, it is maximum at around 650° C. and decreases for both higher and lower temperatures The number of nuclei formed in the spherulites is in the range of 5–100/cm$^2$ and the diameter of the spherulites ranges from 0.5–4 mm, depending on the nucleating position and density.

The growth rate of the spherulites that form in the amorphous material is highly dependent on temperature. Rising with increasing temperature, it is virtually zero (less than 1 $\mu$m/min) at temperatures below the crystallization temperature but several hundreds of $\mu$m per minute in the vicinity of the melting point. Thus once spherulites have formed on the high-temperature side of the amorphous specimen 1, the growth rate thereof can be controlled by lowering the hot plate 2 at a rate on the order of the crystal growth rate so as to ensure effective heating of the amorphous specimen 1 from the periphery thereof by the furnace 4. Alternatively the hot plate 2 can be held stationary and the furnace 4 raised. It is also possible to increase the hot plate temperature in accordance with crystal growth.

FIG. 2($a$) is an explanatory view showing the spherulites formed only on the high-temperature side 14 of a $B_2O_3$—$Li_2O$ system amorphous material specimen 1 as a result of heat treating it to impart a temperature gradient thereto in the manner explained earlier. As the formed spherulites 11 grow in diameter, they come in contact with each other as shown in FIG. 2($b$). Reference numeral 13 designates bulk nuclei, which are preferably not present. Once the spherulites 11 have grown in diameter to the point that adjacent ones thereof are in full contact with each other, the crystal fibers constituting the spherulites 11 grow under directional restriction toward the low-temperature side 15, as shown in FIG. 2($c$). In FIG. 2($d$), which shows the state after the crystal fibers 12 have grown as far as the low-temperature side 15, it will be noted that while the spherulites 11 that formed on the high-temperature side 14 of the amorphous specimen 1 still extend laterally, the direction changes toward the vertical during crystal growth, with the crystal fibers 12 that have grown to the low-temperature side 15 being vertically oriented and being offset by an angle of approximately 90 degrees with respect to those on the high-temperature side 14. A prescribed high frequency is applied to electrodes attached to the high- and low-temperature sides to thereby obtain a polycrystal piezoelectric device having an $Li_2B_4O_7$ piezoelectric phase, which generates different modes of vibration on the two sides.

Figure 3:
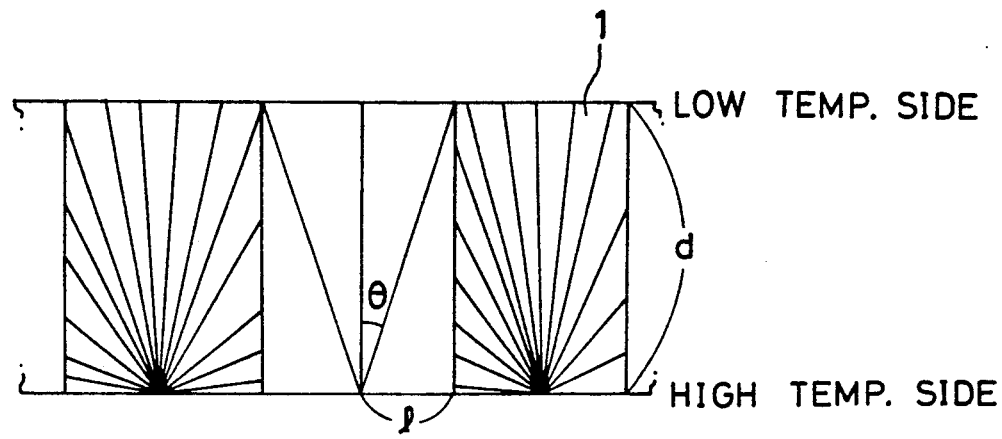
FIG. 3 a schematic view for showing the relationship between the spherulite nucleation occurrence rate and the crystal orientation.

The relationship between the spherulite nucleation occurrence rate in the amorphous specimen 1 (the number of nuclei occurring per unit time per unit area) and the crystal orientation will be explained with reference to FIG. 3, in which d designates the certain distance from the high-temperature side of the amorphous material and l designates the spherulite radius. It can be seen that when a spherulite of radius l forms from the high-temperature side of the amorphous specimen 1, the crystal orientation at the plane located to the low-temperature side from the high-temperature side is within the range of the angle $\theta$ expressed by the term $\tan^{-1}$ (l/d) from the direction of radial growth of the spherulites. Therefore, the smaller the radius l of the spherulites and the deeper the depth d, the greater is the degree of orientation at the plane at depth d.

Qualitatively speaking, the higher the nucleating density, the greater is the tendency for the crystals of the spherulites to be oriented vertically at positions near the high-temperature side.

By discontinuing the crystallization treatment before crystallization of the amorphous material has advanced to the low-temperature side, it is possible to fabricate a device having a dual structure consisting of a piezoelectric portion constituted of spherulites and an amorphous portion not exhibiting piezoelectricity.

As is clear from the foregoing description, by heat treating an amorphous material in which spherulites including a piezoelectric phase crystallize from a bulk glass phase so as to impart it with a temperature gradient, the present invention makes it possible to fabricate a piezoelectric device in which crystals exhibiting piezoelectricity are oriented in different prescribed directions. As the device exhibits different oscillation modes at different portions thereof, it can be advantageously applied, for example, as the oscillator of an oscillation circuit having a feedback section or as an actuator for microscopic translational motion.

The invention will now be explained with respect to specific examples, which should not be construed as limiting is scope in any way.

EXAMPLES

A mixture was obtained by blending 10.86 g of high purity $Li_2CO_3$ powder and 49.14 g of high purity $H_3BO_3$ For eliminating $H_2O$ and $CO_2$ therefrom, the mixture was placed in a platinum crucible and heated from 100° C. to 200° C. over 4 hours and from 450° C. to 700° C. over 7 hours. It was then heated to 1,100° C., a temperature 100°–200° C. higher than its liquidus, and held at this temperature for 1 hour to obtain a uniform melt. The melt was cast into a carbon mold preheated to about 300° C. measuring 15 mm in diameter and 2 mm in thickness, whereby there was obtained a disk-shaped amorphous specimen.

The disk-shaped amorphous specimen was relieved of thermal strain by annealing for 3 minutes at 400° C. and was then polished with alumina powder and rinsed.

The polished specimen was placed in intimate contact with the upper surface of the hot plate of a temperature gradient furnace of the type shown in FIG. 1 and the hot plate was heated to 630° C. to subject the specimen to crystallization treatment. The crystallization treatment was continued over a period of 3 hours, during which the hot plate was lowered at the rate of 50 $\mu$m/min. The temperature gradient of the specimen during the crystallization treatment was 20°–30° C./mm. About 50 spherulites having a $Li_2B_4O_7$ as a piezoelectric phase formed per cm² of the specimen. The spherulites had diameters falling in the range of 100–300 $\mu$m.

Figure 4A:
FIG. 4(a) is a micrograph magnified to 67 diameters of the texture of the polycrystal piezoelectric device according to this invention.
Figure 4B:
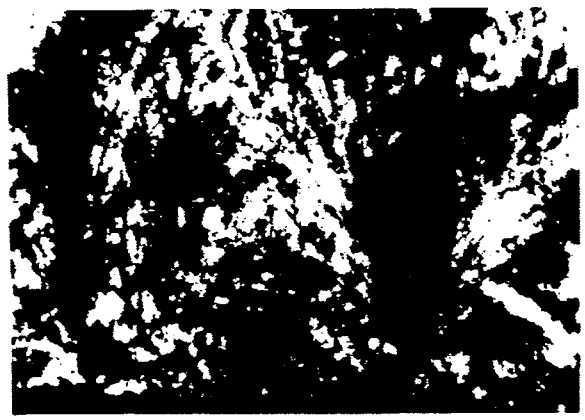
FIG. 4(b) is a micrograph magnified to 133 diameters of the texture of the polycrystal piezoelectric device according to this invention.
Figure 4C:
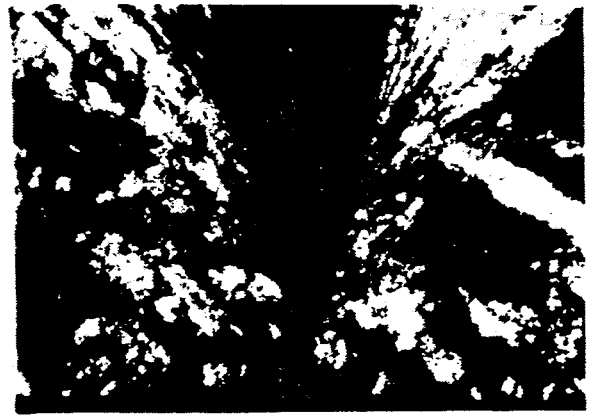
FIG. 4(c) is a micrograph magnified to 266 diameters of the texture of the polycrystal piezoelectric device according to this invention.

FIG. 4 shows micrographs taken with a transmission polarization optical microscope of the crystallographic structure at the low-temperature side of the so-obtained polycrystal body along a sectional plane lying parallel to the direction of the temperature gradient. The micrographs of FIG. 4(a), FIG. 4(b) and FIG. 4(c) are at magnifications of X67, X133 and X266, respectively.

From the optically quenched portions appearing as black regions in the photographs, it can be seen that the $Li_2B_4O_7$ crystals have a specific orientation with respect to the radial direction of spherulites.

Figure 5:
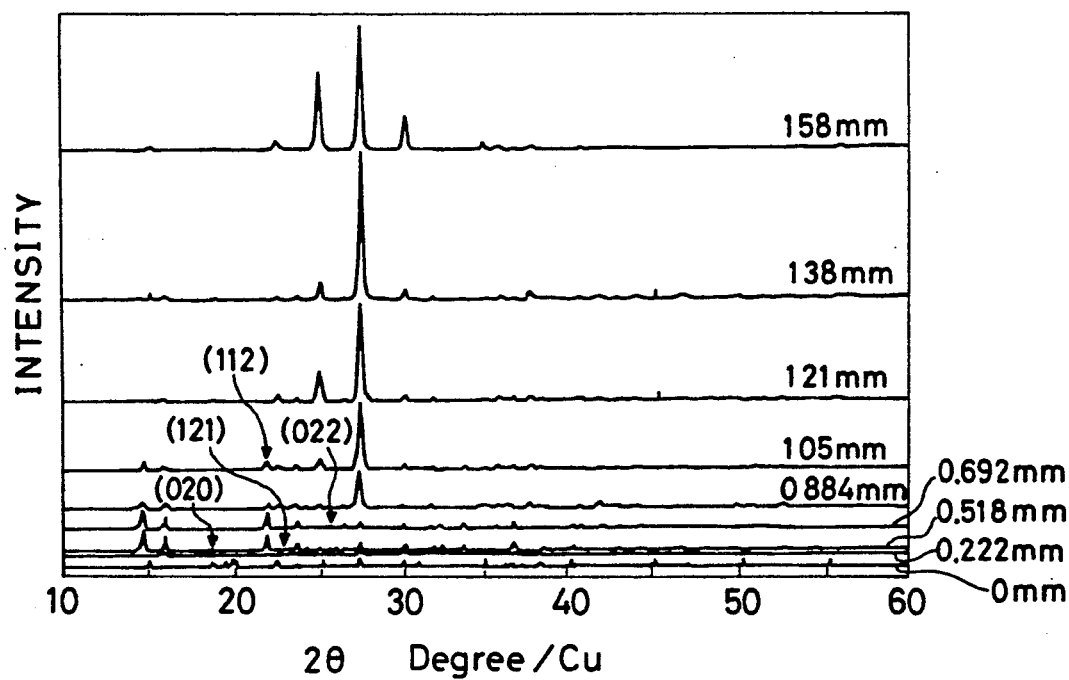
FIG. 5 is a graph showing the x-ray diffraction intensities at different depths within the polycrystal piezoelectric device according to the invention.

FIG. 5 is a graph showing the x-ray diffraction intensity of the polycrystal piezoelectric body at planes lying perpendicular to the direction of the temperature gradient at various depths from the surface that was in contact with the hot plate. The fact that the ratio among the intensities of the x-ray peaks at the diffraction surfaces differs with the depth of the diffraction plane shows that the crystallographic orientation varies with depth. Moreover the fact each x-ray diffraction intensity exhibits a maximum value at a specific depth indicates the presence of spherulites with the orientation shown in FIG. 2(a).

Figure 6A:
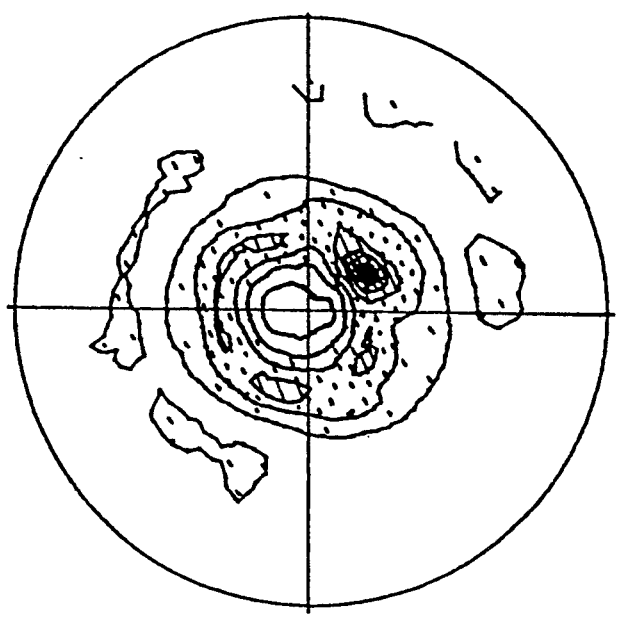
FIG. 6(a) is a pole figure showing the x-ray diffraction intensity of the (112) plane of the polycrystal piezoelectric device according to the invention.
Figure 6B:
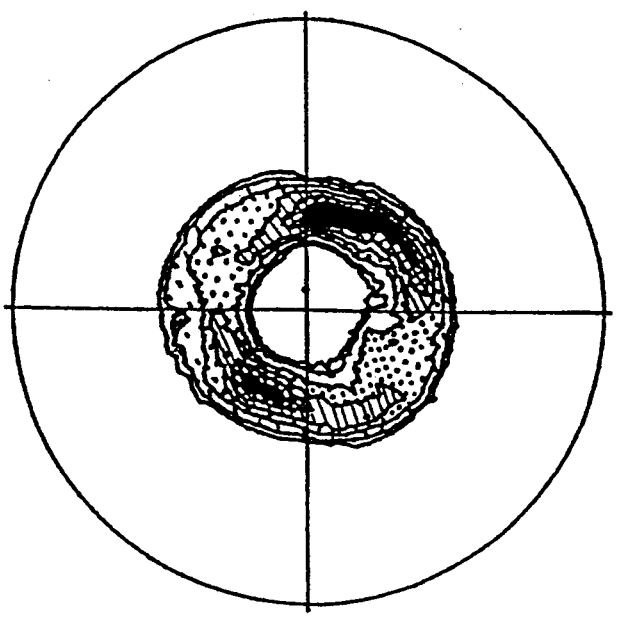
FIG. 6(b) is a pole figure showing the x-ray diffraction intensity of the (123) plane of the polycrystal piezoelectric device according to the invention.

FIG. 6(a) and FIG. 6(b) are pole figures showing the x-ray diffraction intensities of the (112) and (123) planes of $Li_2O.B_2O_3$ polycrystal at a depth of 0.5 mm in the direction of the temperature gradient. The regions differentiated by shading density in the figures represent relative intensities with respect to the same peaks of a powder specimen and indicate the amount of deviation from a material not having random orientation. Thus the darker a region appears in the figures, the higher is its degree of orientation. The fact that both FIG. 6(a) and FIG. 6(b) include doughnut-shaped regions with high degrees of orientation shows that the crystallographic planes (112) and (123) are oriented at specific angles with respect to the direction normal to the x-ray diffraction measurement surface of the specimen.

What is claimed is:

1. A polycrystal piezoelectric device comprising a plurality of crystals formed by growth of spherulites including a piezoelectric phase consisting of $Li_2B_4O_7$ so as to vary continuously in orientation over about 90 degrees between a first side of the device and a second side thereof.

2. A polycrystal piezoelectric device according to claim 1 wherein the plurality of crystals are oriented laterally at the first side and are oriented vertically at the second side.

3. A method of producing a polycrystal piezoelectric device comprising the steps of heat treating an amorphous material in which spherulites having a $Li_2B_4O_7$ as a piezoelectric phase crystallize from a bulk glass phase so as to impart it with a temperature gradient by causing a first side thereof to have a temperature not higher than the melting point of the amorphous material, a second side thereof to have a temperature not lower than the crystallization temperature of the amorphous material and the temperature of the first side to be higher than the temperature of the second side, and allowing crystals of spherulites formed on the first side to grow toward the second side.

4. A method of producing a polycrystal piezoelectric device according to claim 3 wherein the amorphous material is one obtained by melting and molding $Li_2CO_3$ and $H_3BO_3$.

5. A method of producing a polycrystal piezoelectric device comprising the steps of maintaining $Li_2CO_3$ and $H_3BO_3$ at a temperature in the vicinity of 1,100° C. for at least one hour to obtain a melt, molding and rapid-cooling the melt to obtain a shaped amorphous material, imparting a temperature gradient to the shaped amorphous material by heating a first side thereof to a temperature of not higher than about 900° C., heating a second side thereof to a temperature not lower than about 550° C., causing the temperature of the first side to be higher than the temperature of the second side, and allowing spherulites having a piezoelectric phase consisting of $Li_2B_4O_7$ to grow from the first side toward the second side.

6. A method of producing a polycrystal piezoelectric device according to claim 5 wherein the amorphous material is formed to comprise about 34-20 mol% $Li_2CO_3$ and about 66-80 mol% $B_2O_3$.

* * * * *

UNITED STATES PATENT AND TRADEMARK OFFICE
CERTIFICATE OF CORRECTION

PATENT NO. : 5,127,982
DATED : July 7, 1992
INVENTOR(S) : Shigeo Kotake

It is certified that error appears in the above-identified patent and that said Letters Patent is hereby corrected as shown below: On the title page, Item [73]

The assignee is incorrect, should be, --Agency of Industrial Science & Technology, Ministry of International Trade & Industry, Tokyo, Japan--.

Signed and Sealed this

Twenty-fourth Day of August, 1993

Attest:

BRUCE LEHMAN

Attesting Officer

Commissioner of Patents and Trademarks